US011616343B2

(12) United States Patent
Yang et al.

(10) Patent No.: US 11,616,343 B2
(45) Date of Patent: Mar. 28, 2023

(54) VERTICAL-CAVITY SURFACE-EMITTING LASER WITH A TUNNEL JUNCTION

(71) Applicant: Lumentum Operations LLC, San Jose, CA (US)

(72) Inventors: Jun Yang, Cupertino, CA (US); Guowei Zhao, Milpitas, CA (US); Matthew Glenn Peters, Menlo Park, CA (US); Eric R. Hegblom, Sunnyvale, CA (US); Ajit Vijay Barve, San Jose, CA (US); Benjamin Kesler, Sunnyvale, CA (US)

(73) Assignee: Lumentum Operations LLC, San Jose, CA (US)

( * ) Notice: Subject to any disclaimer, the term of this patent is extended or adjusted under 35 U.S.C. 154(b) by 233 days.

(21) Appl. No.: 16/948,763

(22) Filed: Sep. 30, 2020

(65) Prior Publication Data
US 2021/0367407 A1 Nov. 25, 2021

Related U.S. Application Data

(60) Provisional application No. 63/028,248, filed on May 21, 2020.

(51) Int. Cl.
*H01S 5/00* (2006.01)
*H01S 5/30* (2006.01)
(Continued)

(52) U.S. Cl.
CPC ........ *H01S 5/3095* (2013.01); *H01S 5/18311* (2013.01); *H01S 5/18358* (2013.01);
(Continued)

(58) Field of Classification Search
CPC .... H01S 5/3095; H01S 5/183; H01S 5/18358; H01S 5/3416; H01S 5/0421; H01S 5/18311; H01S 5/18361–1838
See application file for complete search history.

(56) References Cited

U.S. PATENT DOCUMENTS

| 5,936,266 A | 8/1999 | Holonyak, Jr. et al. |
| 6,052,398 A * | 4/2000 | Brillouet ............. H01S 5/18305 |
| | | 372/46.01 |

(Continued)

OTHER PUBLICATIONS

Hall et al., "Electrically-pumped, single-epitaxial VCSELs at 1.55 μm with Sb-based mirrors," Electronic Letters, vol. 35, No. 16, Aug. 5, 1999, pp. 1337-1338.

(Continued)

*Primary Examiner* — Kinam Park
(74) *Attorney, Agent, or Firm* — Harrity & Harrity, LLP

(57) ABSTRACT

A VCSEL may include an n-type substrate layer and an n-type bottom mirror on a surface of the n-type substrate layer. The VCSEL may include an active region on the n-type bottom mirror and a p-type layer on the active region. The VCSEL may include an oxidation layer over the active region to provide optical and electrical confinement of the VCSEL. The VCSEL may include a tunnel junction over the p-type layer to reverse a carrier type of an n-type top mirror. Either the oxidation layer is on or in the p-type layer and the tunnel junction is on the oxidation layer, or the tunnel junction is on the p-type layer and the oxidation layer is on the tunnel junction. The VCSEL may include the n-type top mirror over the tunnel junction, a top contact layer over the n-type top mirror, and a top metal on the top contact layer.

18 Claims, 16 Drawing Sheets

(51) Int. Cl.
*H01S 5/183* (2006.01)
*H01S 5/34* (2006.01)
*H01S 5/042* (2006.01)

(52) U.S. Cl.
CPC ...... *H01S 5/18361* (2013.01); *H01S 5/18366* (2013.01); *H01S 5/0421* (2013.01); *H01S 5/183* (2013.01); *H01S 5/1838* (2013.01); *H01S 5/18363* (2013.01); *H01S 5/18369* (2013.01); *H01S 5/18372* (2013.01); *H01S 5/18375* (2013.01); *H01S 5/18377* (2013.01); *H01S 5/3416* (2013.01)

(56) References Cited

U.S. PATENT DOCUMENTS

| | | | |
|---|---|---|---|
| 6,487,230 B1 | 11/2002 | Boucart et al. | |
| 6,760,357 B1 | 7/2004 | Boucart | |
| 6,771,680 B2 | 8/2004 | Bour | |
| 6,798,817 B2 | 9/2004 | Wrycraft | |
| 6,810,065 B1* | 10/2004 | Naone | H01S 5/18311 372/45.01 |
| 6,936,486 B2 | 8/2005 | Cheng et al. | |
| 6,982,439 B2 | 1/2006 | Bhat et al. | |
| 7,123,638 B2 | 10/2006 | Leary et al. | |
| 7,501,294 B1 | 3/2009 | Nakagawa | |
| 7,620,087 B2 | 11/2009 | Philippens et al. | |
| 7,856,045 B2 | 12/2010 | Philippens et al. | |
| 7,916,768 B2 | 3/2011 | Chang et al. | |
| 8,355,423 B2 | 1/2013 | Moser et al. | |
| 9,088,134 B2 | 7/2015 | Hibbs-Brenner et al. | |
| 2001/0043629 A1* | 11/2001 | Sun | H01S 5/426 257/E33.069 |
| 2003/0156616 A1* | 8/2003 | Kwon | H01S 5/18308 372/96 |
| 2005/0063440 A1* | 3/2005 | Deppe | H01S 5/18327 372/50.1 |
| 2005/0243890 A1* | 11/2005 | Kim | B82Y 20/00 372/98 |
| 2010/0111125 A1* | 5/2010 | Kondo | H01S 5/1833 372/45.01 |
| 2011/0222569 A1* | 9/2011 | Takeda | H01S 5/18388 438/32 |
| 2012/0138130 A1 | 6/2012 | Guter et al. | |
| 2017/0256915 A1 | 9/2017 | Ghosh et al. | |
| 2018/0241177 A1 | 8/2018 | Wong et al. | |

OTHER PUBLICATIONS

Sarmiento, "Continuous-Wave Operation of GaAs-Based 1.5 μm GaInNAsSb VCSELs," IEEE Photonics Techology Letters, vol. 31, No. 20, Oct. 15, 2019, pp. 1607-1610.

* cited by examiner

VERTICAL-CAVITY SURFACE-EMITTING LASER WITH A TUNNEL JUNCTION

CROSS-REFERENCE TO RELATED APPLICATION

This Patent Applications claims priority to U.S. Provisional Patent Application No. 63/028,248, filed on May 21, 2020, and entitled "VERTICAL-CAVITY SURFACE-EMITTING LASER PERFORMANCE IMPROVEMENT USING TUNNEL JUNCTION." The disclosure of the prior Application is considered part of and is incorporated by reference into this Patent Application.

TECHNICAL FIELD

The present disclosure relates generally to a vertical-cavity surface-emitting laser (VCSEL) and, more particularly, to a VCSEL including a tunnel junction that improves performance of the VCSEL.

BACKGROUND

A VCSEL is a semiconductor laser, more specifically a diode laser with a monolithic laser resonator, where light is emitted in a direction perpendicular to a chip surface. Typically, the laser resonator consists of two distributed Bragg reflector (DBR) mirrors parallel to the chip surface, between which is an active region (consisting of one or more quantum wells) that generates light. Commonly, the upper and lower mirrors of a VCSEL are doped as p-type and n-type materials, respectively, thereby forming a diode junction.

SUMMARY

In some implementations, a VCSEL includes an n-type substrate layer having a top surface and a bottom surface; an n-type metal on the bottom surface of the n-type substrate layer, the n-type metal being a cathode of the VCSEL; an n-type bottom mirror on the top surface of the n-type substrate layer; an active region on the n-type bottom mirror; a p-type layer on the active region; an oxidation layer over the active region, wherein the oxidation layer is to provide optical and electrical confinement of the VCSEL; a tunnel junction over the p-type layer, wherein the tunnel junction is to reverse a carrier type of an n-type top mirror, and wherein either: the oxidation layer is on or in the p-type layer and the tunnel junction is on the oxidation layer, or the tunnel junction is on the p-type layer and the oxidation layer is on the tunnel junction; the n-type top mirror over the tunnel junction; a top contact layer over the n-type top mirror; and a top metal on the top contact layer, the top metal being an anode of the VCSEL.

In some implementations, a VCSEL array includes an active region on an n-type bottom mirror; a p-type layer on the active region; an oxidation layer over the active region to provide optical and electrical confinement of VCSELs in the VCSEL array; and a tunnel junction over the p-type layer to reverse a carrier type of an n-type top mirror that is over the tunnel junction, wherein either: the oxidation layer is on or in the p-type layer and the tunnel junction is on the oxidation layer, or the tunnel junction is on the p-type layer and the oxidation layer is on the tunnel junction In some implementations, a method includes forming an n-type bottom mirror on a surface of an n-type substrate layer; forming an active region on the n-type bottom mirror; forming a p-type layer on the active region; forming an oxidation layer over the active region; forming a tunnel junction over the p-type layer, wherein either: the oxidation layer is formed on or in the p-type layer and the tunnel junction is formed on the oxidation layer, or the tunnel junction is formed on the p-type layer and the oxidation layer is formed on the tunnel junction; and forming an n-type top mirror over the tunnel junction.

DETAILED DESCRIPTION

The following detailed description of example implementations refers to the accompanying drawings. The same reference numbers in different drawings may identify the same or similar elements.

For a diode laser, such as a VCSEL, electrons and holes need to be injected into an active region (e.g., a quantum well active region) from opposite sides. This is typically achieved by placing a p-type contact and a p-type DBR on the top side the active region and by placing an n-type contact and an n-type DBR on the bottom side of the active region. Under positive bias, holes are injected into the active region from the p-type DBR and electrons are injected into the active region from the n-type DBR. The holes and electrons recombine in the active region to emit light. Commonly, the p-type DBR is the upper mirror in the VCSEL, and the n-type DBR is the lower mirror of the VCSEL; but this arrangement can be flipped depending on the geometry of the VCSEL.

Figure 1A:
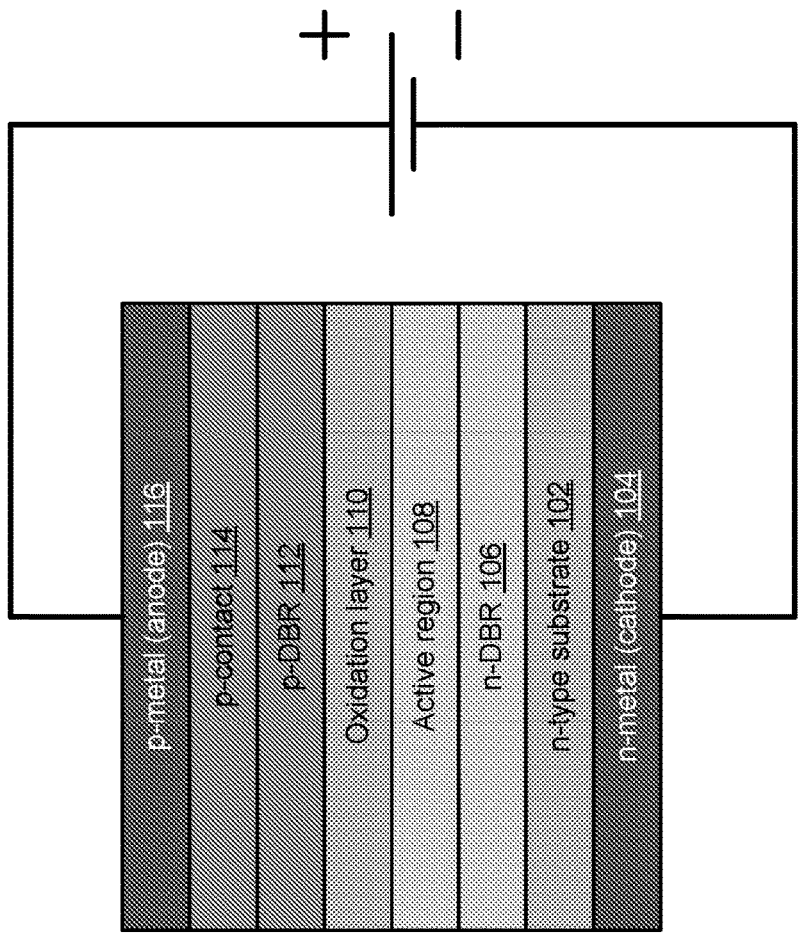
FIGS. 1A and 1B are diagrams illustrating an example of a conventional VCSEL.
Figure 1B:
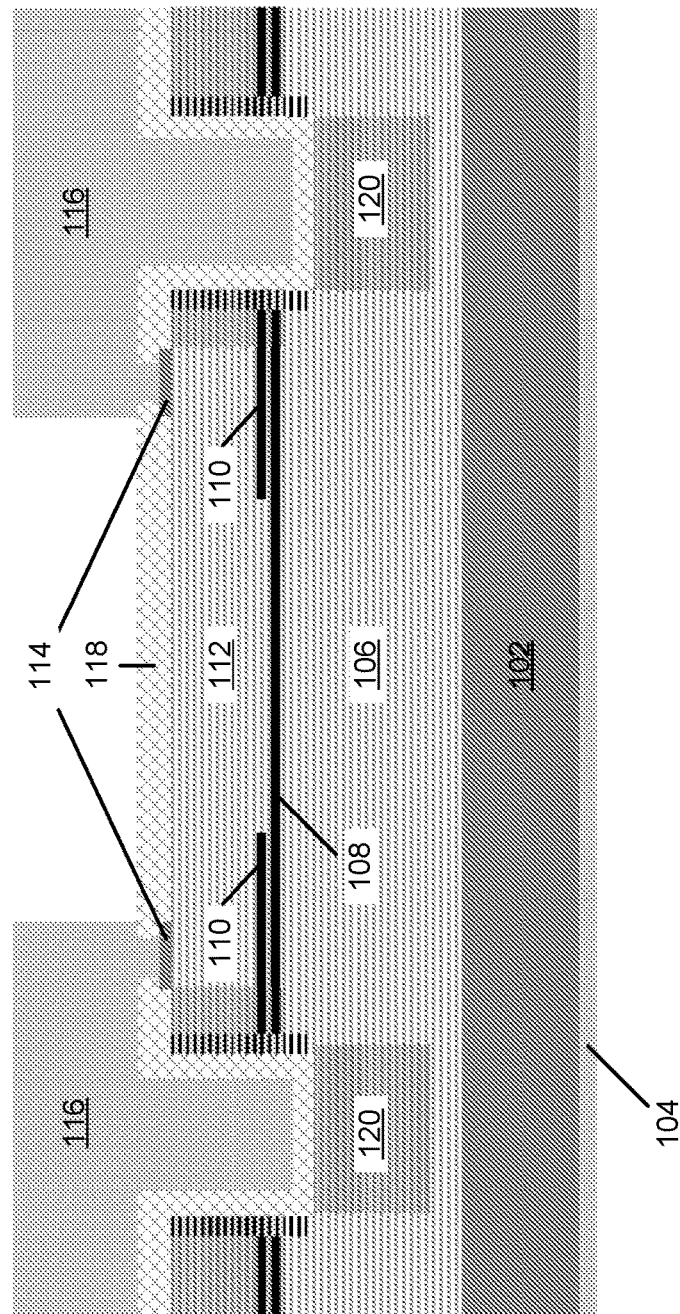

FIGS. 1A and 1B are diagrams illustrating an example of a conventional VCSEL 100. FIG. 1A is a diagram illustrating various layers of the VCSEL 100, while FIG. 1B is a diagram illustrating an example of a cross section of the VCSEL 100 with the layers shown in FIG. 1A. As shown in FIGS. 1A and 1B, the conventional VCSEL includes an n-type substrate 102 with an n-type metal 104 (serving as a cathode) on a bottom surface and an n-type DBR 106 on a top surface. As further shown, the VCSEL 100 includes an active region 108 on the n-type DBR 106, and a p-type DBR 112 on the active region 108. As further shown, a p-type contact 114 is placed on the p-type DBR 112, and a p-type metal 116 (serving as an anode) on the p-type contact 114. As further shown, the VCSEL 100 includes an oxidation layer 110 that forms an oxide aperture (for providing optical and electrical confinement of the VCSEL 100). As shown in FIG. 1B, the oxidation layer 110 is typically above the active region 108 in the p-type DBR 112. Notably, as shown in FIG. 1B, the VCSEL 100 further includes a dielectric layer 118 and an isolation implant 120.

A p-type DBR (e.g., the p-type DBR 112) and a p-type contact (e.g., the p-type contact 114) have holes as the majority carriers, while an n-type DBR (e.g., the n-type DBR 106) and an n-type contact (e.g., the n-type metal 104) have electrons as carriers. In traditional III-V semiconductors, holes have lower mobility than electrons. For example, in gallium arsenide (GaAs) at room temperature, electron mobility is 8500 centimeters squared per volt-second ($cm^2$/V·s), while hole mobility is approximately 400 $cm^2$/V·s. Therefore, the n-type DBR has significantly lower resistance than the p-type DBR.

One parameter for assessing performance of a VCSEL is a voltage drop across the VCSEL. For a conventional VCSEL, such as the VCSEL 100, the resistance of the p-type DBR being higher than the resistance of the n-type DBR means that the voltage drop across the p-type DBR is significantly higher (e.g., approximately two times higher) than the voltage drop across the n-type DBR. Reducing the voltage drop across the VCSEL would improve performance of the VCSEL.

Some implementations described herein provide a VCSEL including a tunnel junction. As described in further detail below, the tunnel junction allows an amount of p-type material in the VCSEL to be reduced (e.g., as compared to the VCSEL 100). In other words, the tunnel junction allows at least some p-type (e.g., a portion of a top mirror) material to be replaced with n-type material within the VCSEL structure. As a result, the voltage drop across the VCSEL is reduced, thereby improving performance of the VCSEL. Further, replacement of p-type material with n-type material in the top mirror of the VCSEL reduces optical absorption loss in the top mirror, and also enables lower doping in the top mirror (e.g., due to higher conductivity of the n-type material as compared the p-type material). Additional details are provided below.

Figure 2:
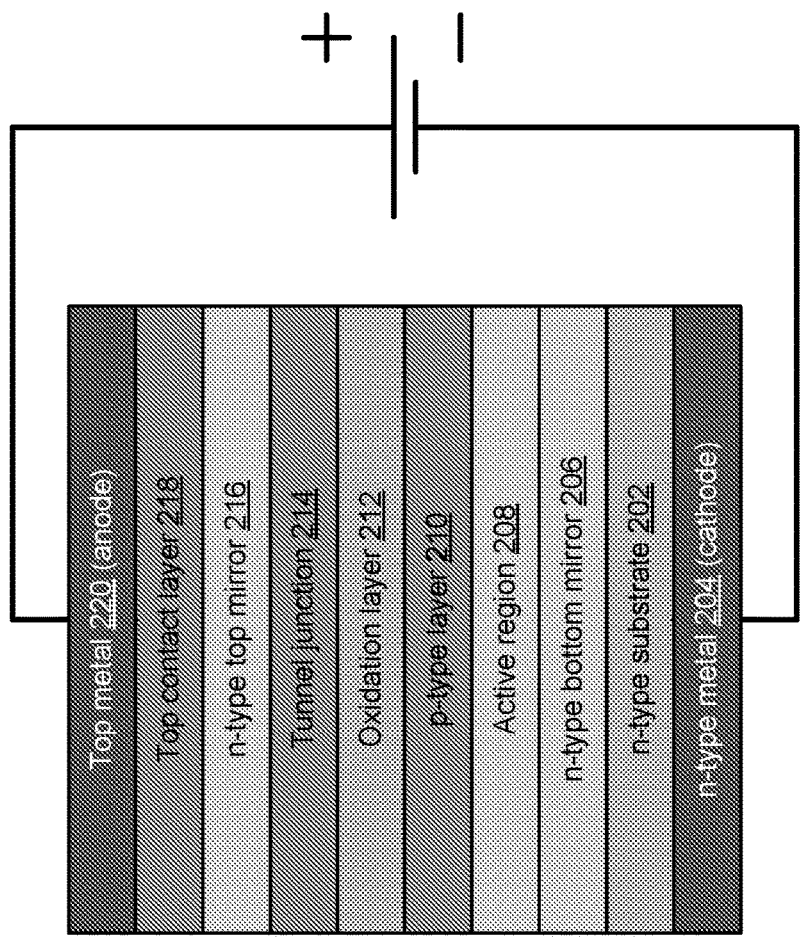
FIG. 2 is a diagram illustrating a VCSEL with a tunnel junction, as described herein.

FIG. 2 is a diagram illustrating an example of a VCSEL 200 with a tunnel junction, as described herein. As shown in FIG. 2, the VCSEL 200 may include an n-type substrate layer 202, an n-type metal 204, an n-type bottom mirror 206, an active region 208, a p-type layer 210, an oxidation layer 212, a tunnel junction 214, an n-type top mirror 216, a top contact layer 218, and a top metal 220. Notably, the order and arrangement of the p-type layer 210, the oxidation layer 212, and the tunnel junction 214 within the VCSEL 200 shown in FIG. 2 is for illustrative purposes, and the order may be different than shown in FIG. 2 (depending on the design of the VCSEL 200). Various example implementations the VCSEL 200 are described below.

In some implementations, VCSEL 200 may be manufactured using a series of procedures. For example, one or more layers of VCSEL 200 may be created using one or more growth procedures, one or more deposition procedures, one or more etching procedures, one or more oxidation procedures, one or more implantation procedures, and/or one or more metallization procedures, among other examples.

The n-type substrate layer 202 includes a substrate comprising an n-type material. In some implementations, other layers of the VCSEL 200 are grown on the n-type substrate layer 202. In some implementations, the n-type substrate layer 202 may be formed from a semiconductor material, such as gallium arsenide (GaAs), indium phosphide (InP), or another type of semiconductor material.

The n-type metal 204 includes an n-type metal layer at a backside of the VCSEL 200. For example, the n-type metal 204 may be a layer that makes electrical contact with the n-type substrate layer 202 (e.g., a backside of n-type substrate layer 202). As a particular example, the n-type metal 204 may include an annealed metallization layer, such as a gold-germanium-nickel (AuGeNi) layer, a palladium-germanium-gold (PdGeAu) layer, among other examples. In some implementations, as indicated in FIG. 2, the n-type metal 204 may serve as a cathode of the VCSEL 200.

The n-type bottom mirror 206 is a bottom reflector of an optical resonator of the VCSEL 200 that is formed from an n-type material. For example, n-type bottom mirror 206 may include a DBR, a dielectric mirror, or another type of mirror structure. In some implementations, the n-type bottom mirror 206 may have a thickness in a range from approximately 3.5 microns (μm) to approximately 9 μm, such as 5 μm. In some implementations, the n-type bottom mirror 206 includes a set of layers (e.g., aluminum gallium arsenide (AlGaAs) layers) grown using a metal-organic chemical vapor deposition (MOCVD) technique, a molecular beam epitaxy (MBE) technique, or another technique.

The active region 208 includes one or more layers where electrons and holes recombine to emit light and define the emission wavelength range of the VCSEL 200. For example, the active region 208 may include one or more quantum wells. In some implementations, the active region 208 may include one or more cavity spacer layers between the n-type top mirror 216 and the n-type bottom mirror 206. The optical thickness of the active region 208 (including cavity spacer layers) and optical thickness of the n-type top mirror 216 and the n-type bottom mirror 206 define the resonant cavity wavelength of the VCSEL 200, which may be designed within an emission wavelength range of the active region to enable lasing. In some implementations, the active region 208 may have a thickness in a range from approximately 0.06 μm to approximately 0.5 μm, such as 0.15 μm or 0.30 μm. In some implementations, the active region 208 includes a set of layers grown using an MOCVD technique, an MBE technique, or another technique.

The p-type layer 210 is a layer comprising a p-type material that is arranged between the tunnel junction 214 and the active region 208. In some implementations, the p-type layer 210 is a thin p-type DBR (p-DBR). In such a case, the p-type DBR is a portion of a top reflector of the optical resonator of the VCSEL 200. For example, the p-type layer 210 may be a p-DBR having fewer than six layer pairs (e.g., one to four layer pairs). In some implementations, such a thin p-DBR has a thickness that is less than or equal to 0.5 μm. FIGS. 3A and 3B, 4A and 4B, 5A and 5B, and 7A and 7B illustrate example implementations of VCSELs 200 in which the p-type layer 210 is a thin p-DBR.

Figure 6A:
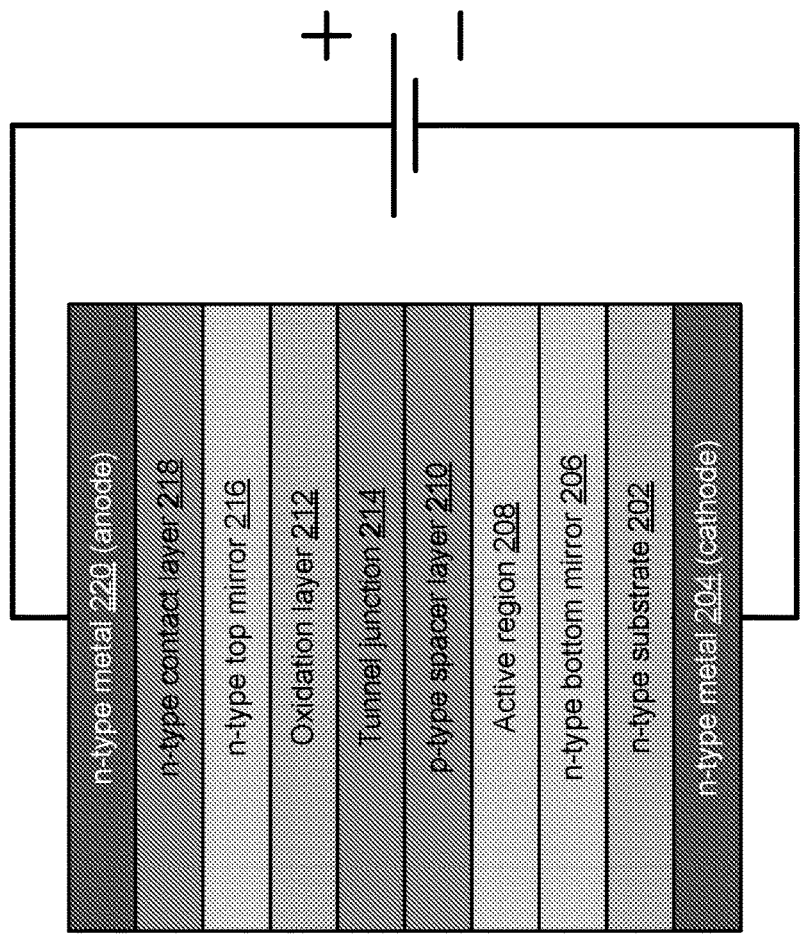
FIGS. 6A and 6B are diagrams illustrating a fourth example implementation of a VCSEL with a tunnel junction, as described herein.
Figure 6B:
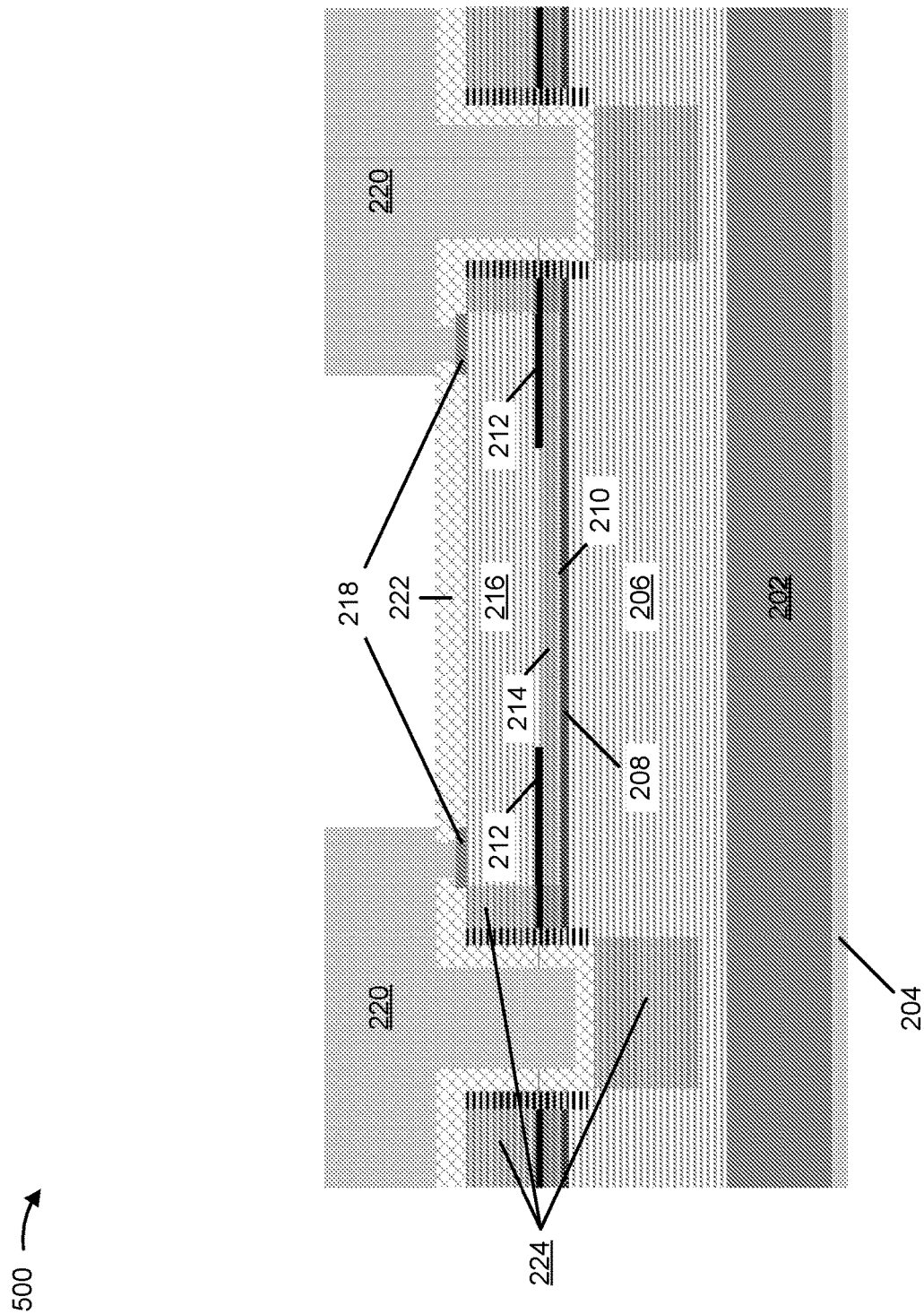

In some implementations, the p-type layer 210 is a p-type spacer layer. A p-type spacer layer is a layer that supports hole injection in the active region 208 but does not serve as a portion of the top reflector of the optical resonator of the VCSEL 200. In some implementations, a p-type spacer layer is one layer of a single material (e.g., rather than multiple layers of alternating materials). In some implementations, the p-type spacer layer may comprise, for example, GaAs, AlGaAs (e.g., 85% Al % AlGaAs), or the like. In some implementations, the p-type spacer layer may have a thickness in a range from approximately 0.1 µm to approximately 1.0 µm. FIGS. 6A and 6B illustrate an example implementation of a VCSEL 200 in which the p-type layer 210 is a p-type spacer layer.

The oxidation layer 212 includes an oxide layer that forms an oxide aperture for providing optical and electrical confinement of the VCSEL 200. In some implementations, the oxidation layer 212 is formed as a result of oxidation of one or more epitaxial layers of the VCSEL. For example, the oxidation layer 212 may be an aluminum oxide ($Al_2O_3$) layer formed as a result of oxidation of an epitaxial layer (e.g., an AlGaAs layer, an aluminum arsenide (AlAs) layer, and/or the like). In some implementations, the oxidation layer 212 may have a thickness in a range from approximately 0.007 µm to approximately 0.04 µm, such as 0.02 µm. In some implementations, oxidation trenches (not shown in FIG. 2) etched around the VCSEL 200 may allow steam to access the epitaxial layer(s) from which the oxidation layer 212 is formed. In some implementations, the oxide aperture has a circular shape. In some implementations, the oxide aperture has a non-circular shape. In some implementations, a size (e.g., a diameter) of the oxide aperture formed by the oxidation layer 212 is in a range from approximately 1 µm to approximately 300 µm, such as 5 µm or 8 µm. In some implementations, the oxidation layer 212 may be on or in the p-type layer 210. In some implementations, the oxidation layer may be on the tunnel junction 214. In some implementations, the oxidation layer 212 may be in the n-type top mirror 216. In some implementations, the oxidation layer 212 may be n-type (e.g., when the oxidation layer 212 is on the opposite side of the tunnel junction 214 from the p-type layer 210).

The tunnel junction 214 comprises one or more layers to reverse a carrier type of the n-type top mirror 216. That is, the tunnel junction 214 includes one or more layers that convert electrons from the n-type top mirror 216 to holes in the p-type layer 210. In some implementations, the tunnel junction 214 is formed by placing one or more layers of highly doped n-type and p-type materials (typically referred to as n++ and p++, respectively). Due to a high intrinsic electric field formed by the junction of the highly doped materials, the tunnel junction 214 allows electrons injected from above the tunnel junction 214 (through the n-type top mirror 216) to be converted to holes below the tunnel junction 214 (in the p-type layer 210). In some implementations, the tunnel junction 214 may have a total thickness in a range from approximately 0.01 µm to approximately 0.12 µm.

In some implementations, the tunnel junction 214 improves performance of the VCSEL 200 by reducing a voltage drop across the VCSEL 200 (e.g., as compared to the VCSEL 100). For example, the use of the tunnel junction 214 enables the VCSEL 200 to include the n-type top mirror 216 and a relatively thin p-type layer 210 above the active region 208 (whereas the VCSEL 100 includes the relatively thick p-type DBR 112 above the active region 108 and no n-type material). As a result, the voltage drop across the VCSEL 200 is reduced, thereby improving performance of the VCSEL 200 (as compared to the VCSEL 100). Notably, in operation of the VCSEL 200, there may be some voltage drop across the tunnel junction 214 (e.g., approximately 0.3 V for a well-optimized junction), which may increase at higher current densities. Thus, the tunnel junction 214 may be placed so as to minimize optical loss and additional voltage drop and maximize the benefit of higher mobility of n-type carriers.

The n-type top mirror 216 is at least a portion of the top reflector of the optical resonator of the VCSEL 200 that is formed from an n-type material. For example, the n-type top mirror 216 may include a DBR, a dielectric mirror, and/or the like. In some implementations, the n-type top mirror 216 may have a thickness in a range from approximately 1 µm to approximately 6 µm, such as 3 µm.

Figure 7A:
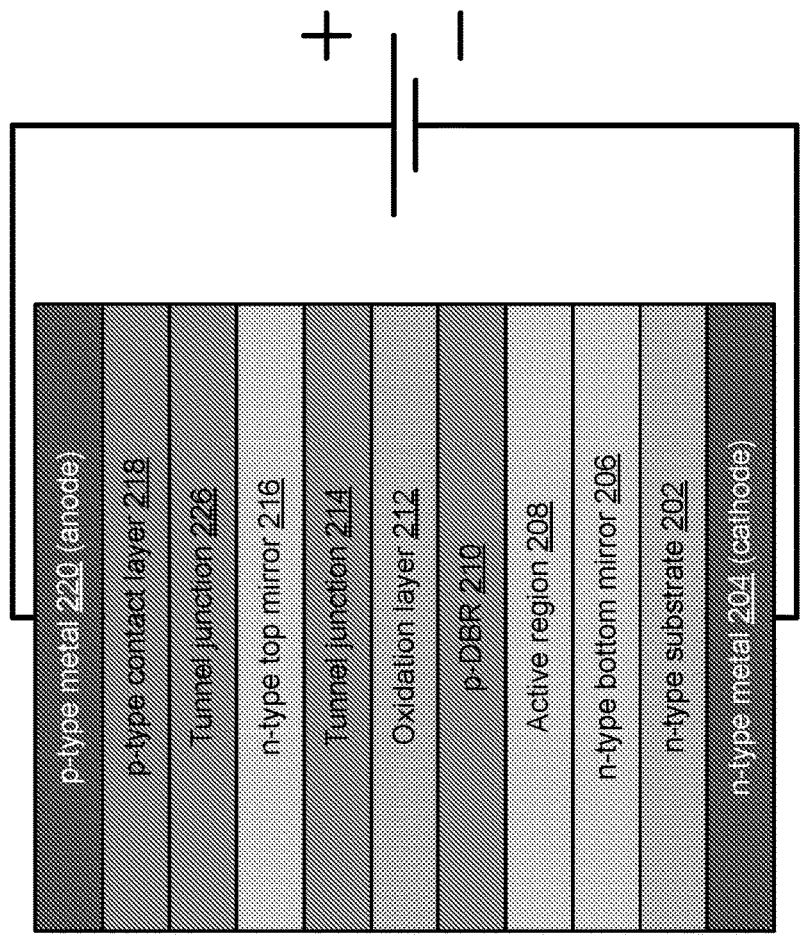
FIGS. 7A and 7B are diagrams illustrating an example implementation of a VCSEL with two tunnel junctions, as described herein.
Figure 7B:
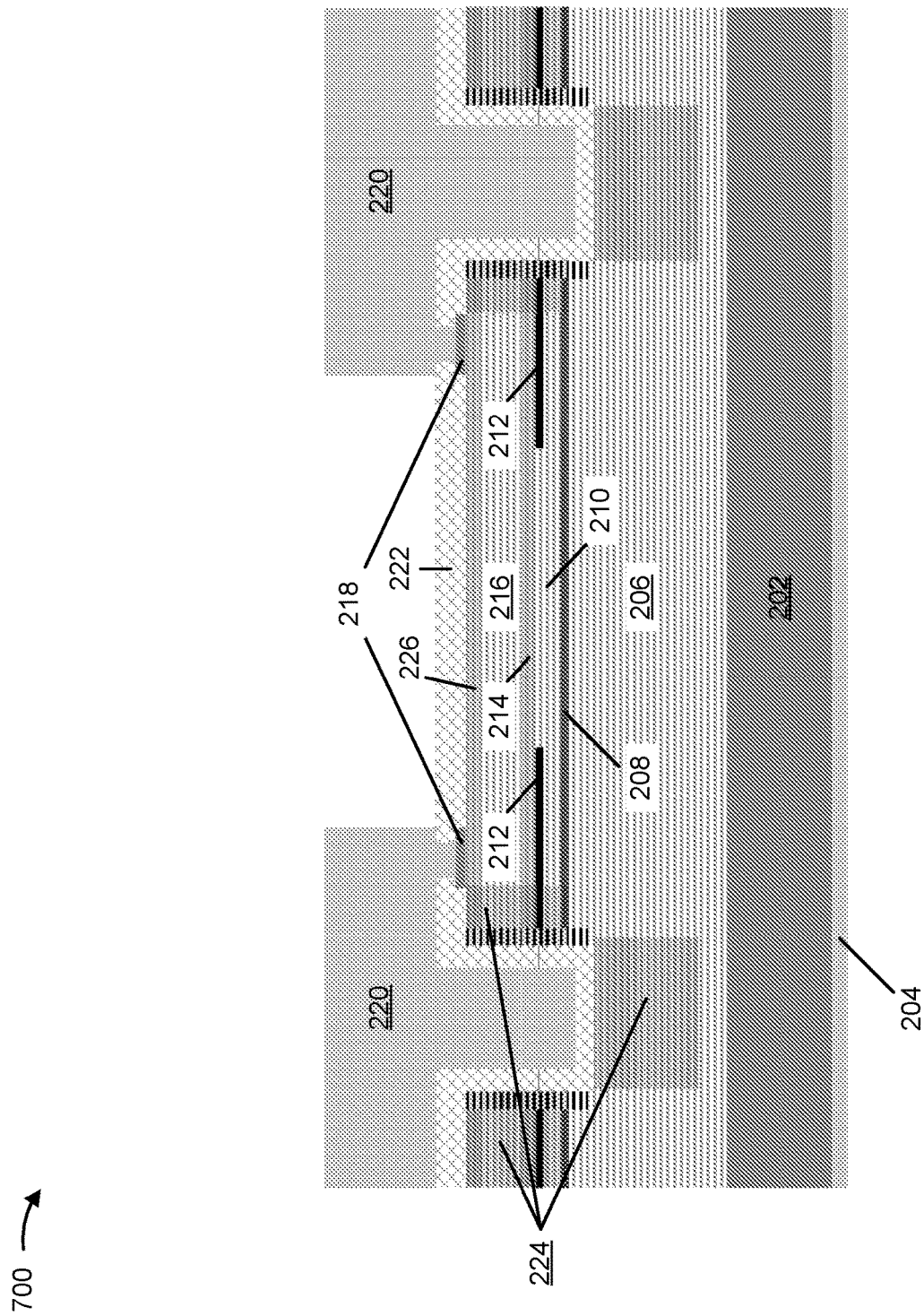

The top contact layer 218 is a layer that makes electrical contact (e.g., directly or through one or more other layers, as described below) with the n-type top mirror 216 through which current may flow. In some implementations, the top contact layer 218 includes an annealed metallization layer. For example, the top contact layer 218 may include a chromium-gold (Cr—Au) layer, a gold-zinc (Au—Zn), a titanium-platinum-gold (TiPtAu) layer, a gold-germanium-nickel (AuGeNi) layer, a palladium-germanium-gold (PdGeAu) layer, or the like. In some implementations, the top contact layer 218 has a thickness in a range from approximately 0.03 µm to approximately 0.3 µm, such as 0.2 µm. In some implementations, the top contact layer 218 has a ring shape, a slotted ring shape, a tooth wheel shape, or another type of circular or non-circular shape (e.g., depending on a design of VCSEL 200). In some implementations, the top contact layer 218 is formed from an n-type material (i.e., the top contact layer 218 may be an n-type contact layer). For example, the top contact layer 218 may be an n-type contact layer when the VCSEL 200 includes a single tunnel junction. FIGS. 3A and 3B, 4A and 4B, 5A and 5B, and 6A and 6B illustrate example implementations of VCSELs 200 in which the top contact layer 218 is an n-type contact layer. In some implementations, the top contact layer 218 is formed from a p-type material (i.e., the top contact layer 218 may be a p-type contact layer). For example, the top contact layer 218 may be a p-type contact layer when the VCSEL 200 includes two tunnel junctions. FIGS. 7A and 7B illustrate an example implementation of a VCSEL 200 in which the top contact layer 218 is a p-type contact layer.

The top metal 220 includes a metal layer at a front side of the VCSEL 200. For example, the top metal 220 may be a layer that makes electrical contact with the top contact layer 218. In some implementations, as indicated in FIG. 2, the top metal 220 may serve as an anode of the VCSEL 200. In some implementations, the top metal 220 is formed from an n-type material (i.e., the top metal 220 may be an n-type metal). For example, the top metal 220 may be an n-type metal when the VCSEL 200 includes a single tunnel junction. FIGS. 3A and 3B, 4A and 4B, 5A and 5B, and 6A and 6B illustrate example implementations of VCSELs 200 in which the top metal 220 is an n-type metal. In some implementations, the top metal 220 is formed from a p-type material (i.e., the top metal 220 may be a p-type metal). For example, the top metal 220 may be a p-type metal when the VCSEL 200 includes two tunnel junctions. FIGS. 7A and 7B illustrate an example implementation of a VCSEL 200 in which the top metal 220 is a p-type metal.

The number, arrangement, thicknesses, order, symmetry, or the like, of layers shown in FIG. 2A are provided as examples. In practice, VCSEL 200 may include additional layers, fewer layers, different layers, differently constructed layers, or differently arranged layers than those shown in FIG. 2. Additionally, or alternatively, a set of layers (e.g., one or more layers) of VCSEL 200 may perform one or more functions described as being performed by another set of layers of VCSEL 200 and any layer may comprise more than one layer.

Figure 3A:
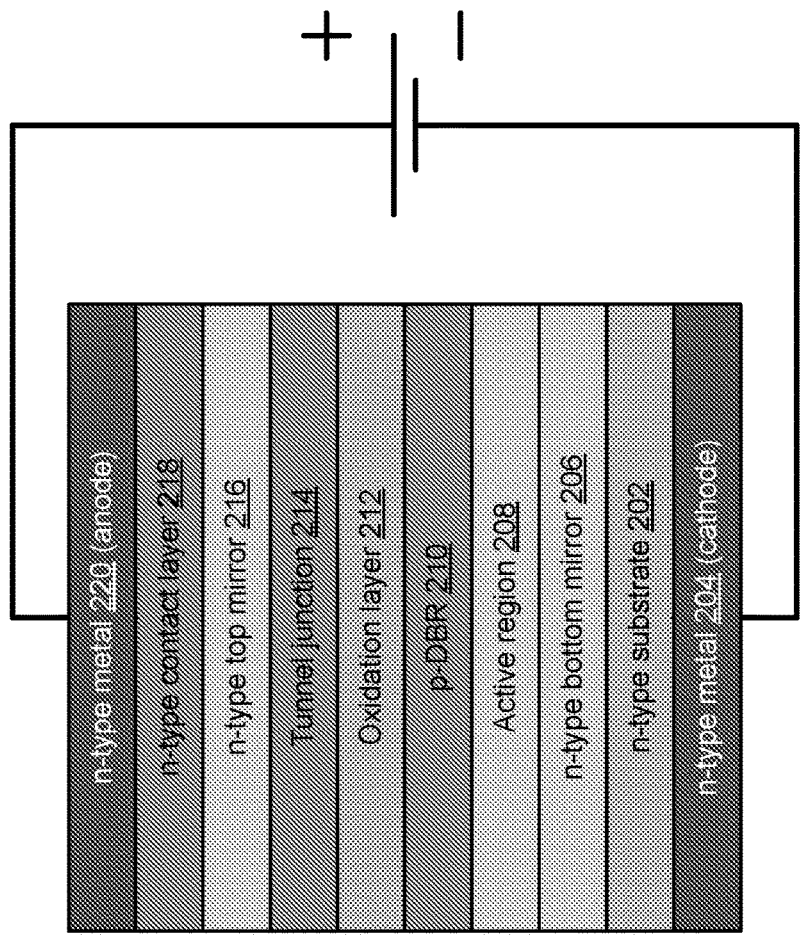
FIGS. 3A and 3B are diagrams illustrating a first example implementation of a VCSEL with a tunnel junction, as described herein.
Figure 3B:
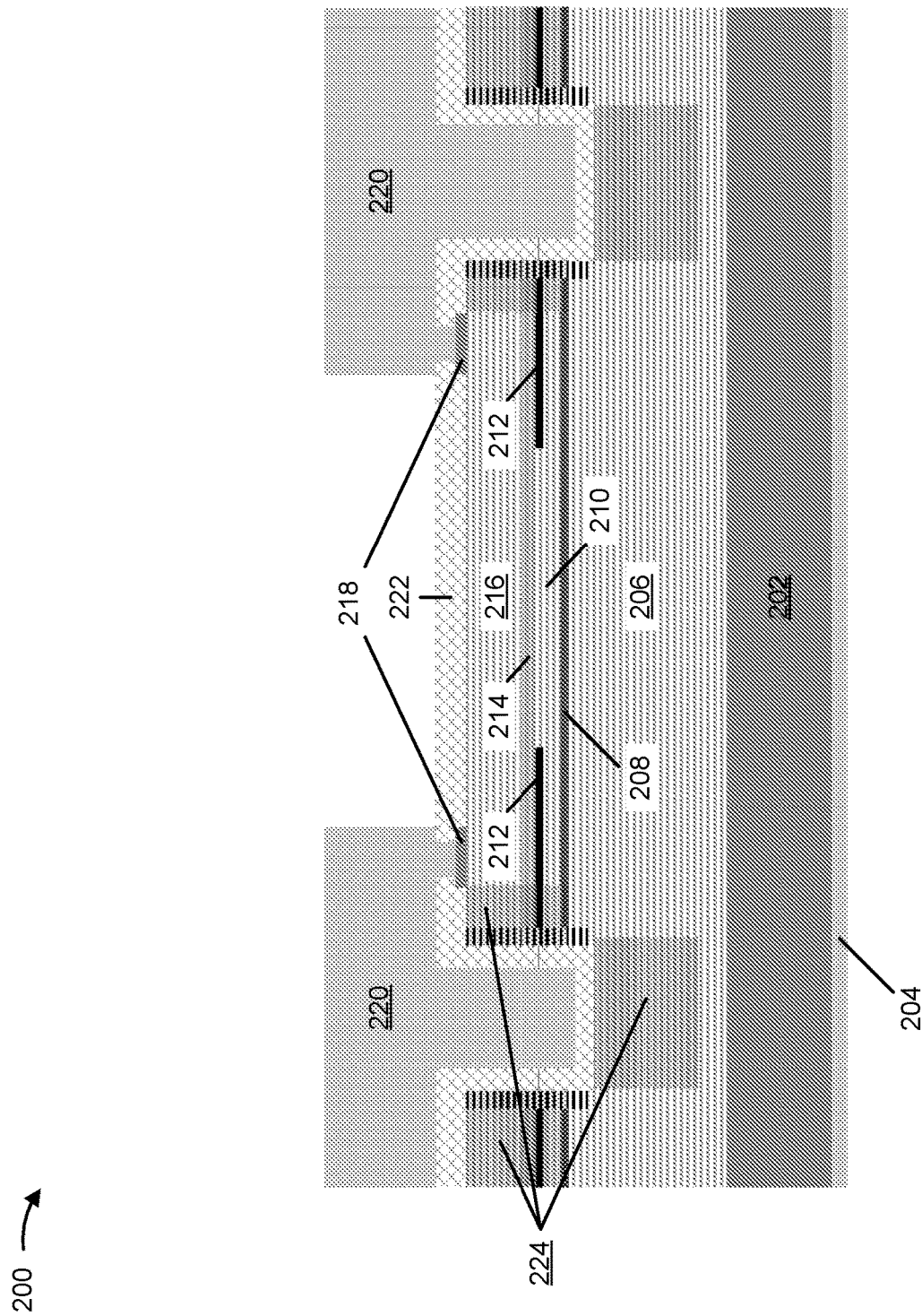

FIGS. 3A and 3B are diagrams illustrating a first example implementation of the VCSEL 200 with the tunnel junction 214, as described herein. In the example shown in FIGS. 3A and 3B, the p-type layer 210 is a p-type DBR, the oxidation layer 212 is on the p-type DBR or in the p-type DBR (e.g., a topmost portion of the p-type DBR), and the tunnel junction 214 is on the oxidation layer 212. Notably, the VCSEL 200 shown in FIG. 3B includes a dielectric layer 222 isolation implant 224. The example implementation of the VCSEL 200 shown in FIGS. 3A and 3B may be desirable in that a majority of the structure of the VCSEL 200 is unchanged (e.g., as compared to the VCSEL 100), meaning that manufacturability of this example implementation of the VCSEL 200 is increased.

The number, arrangement, thicknesses, order, symmetry, or the like, of layers shown in FIGS. 3A and 3B are provided as examples. In practice, VCSEL 200 may include additional layers, fewer layers, different layers, differently constructed layers, or differently arranged layers than those shown in FIGS. 3A and 3B.

Figure 4A:
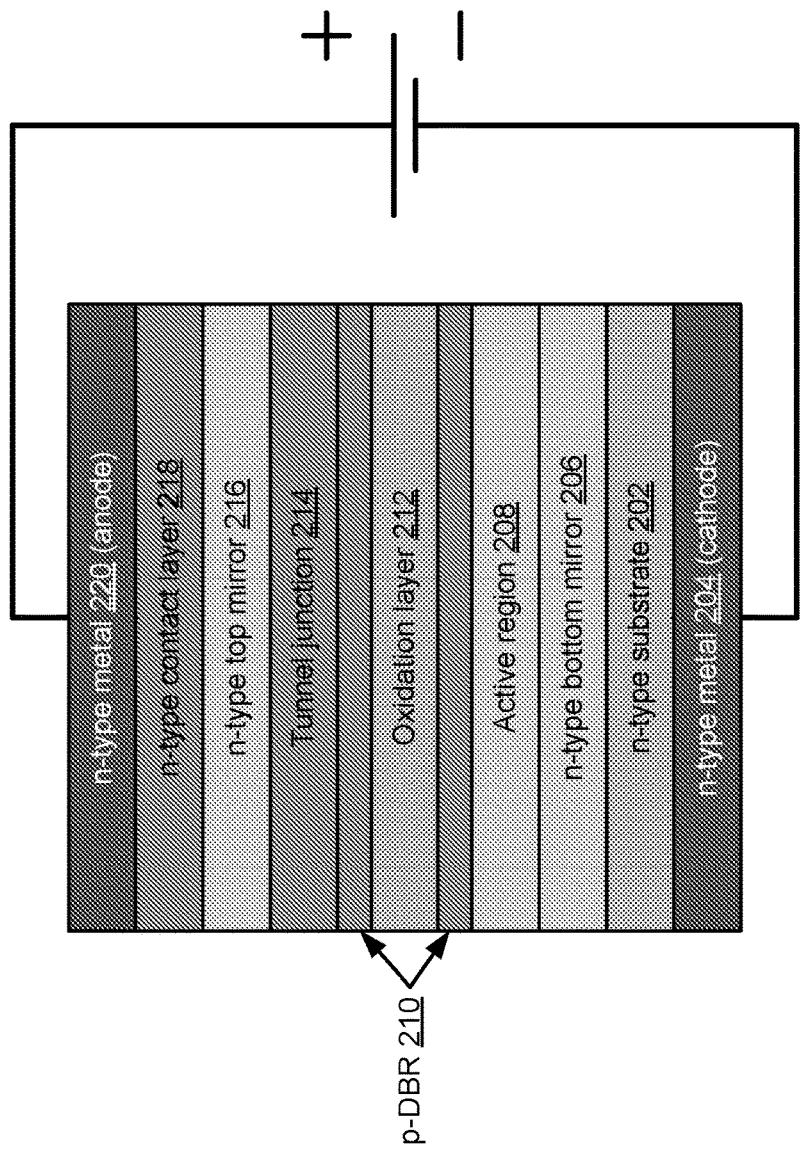
FIGS. 4A and 4B are diagrams illustrating a second example implementation of a VCSEL with a tunnel junction, as described herein.
Figure 4B:
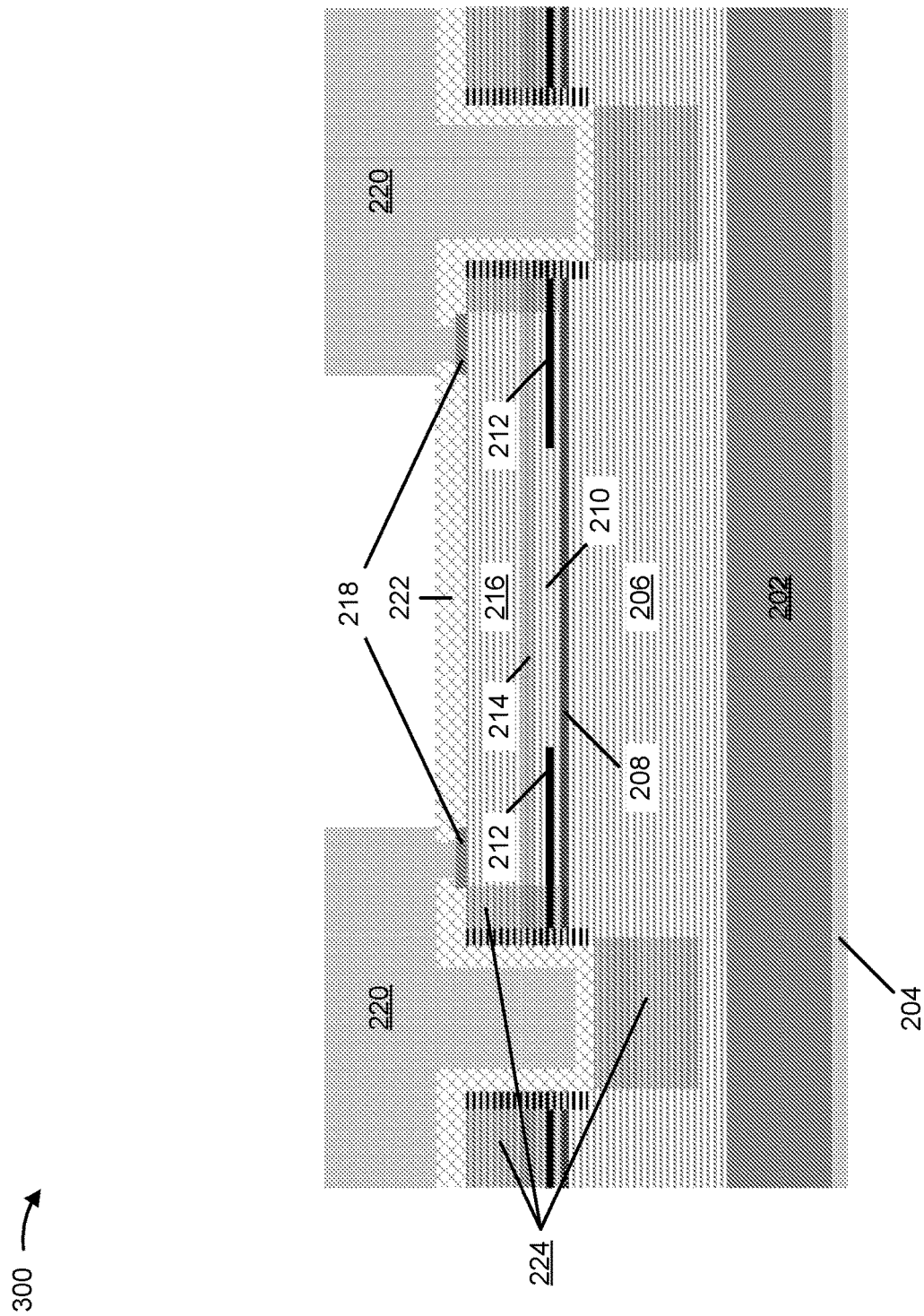

FIGS. 4A and 4B are diagrams illustrating a second example implementation of the VCSEL 200 with the tunnel junction 214, as described herein. In the example shown in FIGS. 4A and 4B, the p-type layer 210 is a p-type DBR, the oxidation layer 212 is in the p-type DBR (e.g., such that a first portion of the p-type DBR is above the oxidation layer 212 and a second portion of the p-type DBR is below the oxidation layer 212), and the tunnel junction 214 is on the p-type DBR. Similar to the example implementation shown in FIGS. 3A and 3B, the example implementation of the VCSEL 200 shown in FIGS. 4A and 4B may be desirable in that a majority of the structure of the VCSEL 200 is unchanged (e.g., as compared to the VCSEL 100), meaning that manufacturability of this example implementation of the VCSEL 200 is increased.

The number, arrangement, thicknesses, order, symmetry, or the like, of layers shown in FIGS. 4A and 4B are provided as examples. In practice, VCSEL 200 may include additional layers, fewer layers, different layers, differently constructed layers, or differently arranged layers than those shown in FIGS. 4A and 4B.

Figure 5A:
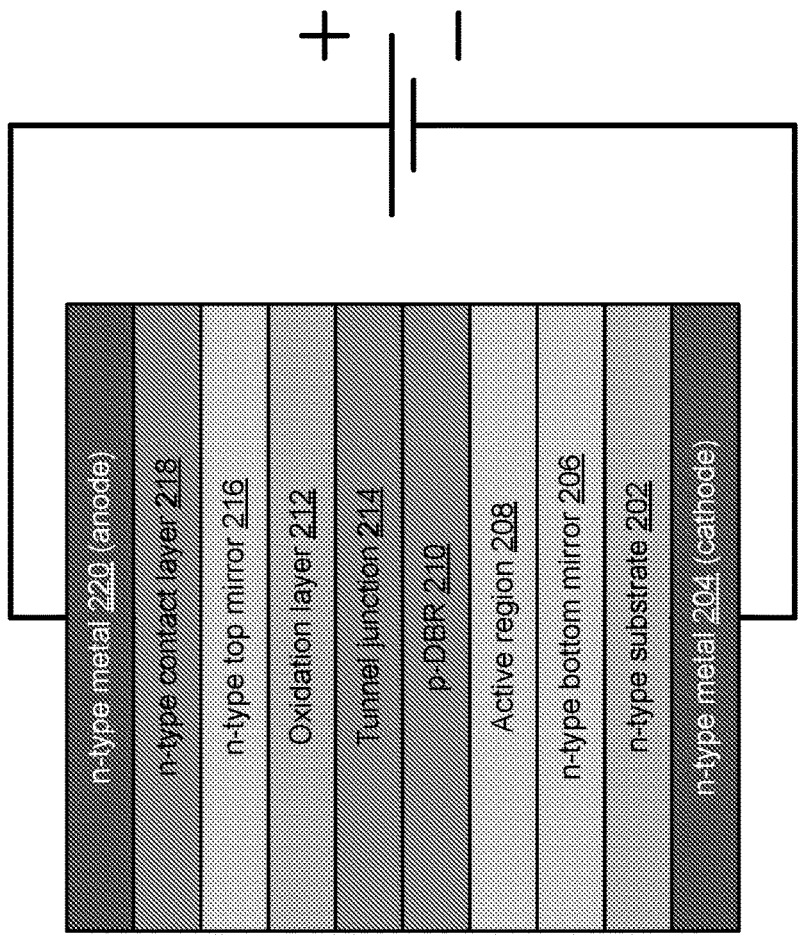
FIGS. 5A and 5B are diagrams illustrating a third example implementation of a VCSEL with a tunnel junction, as described herein.
Figure 5B:
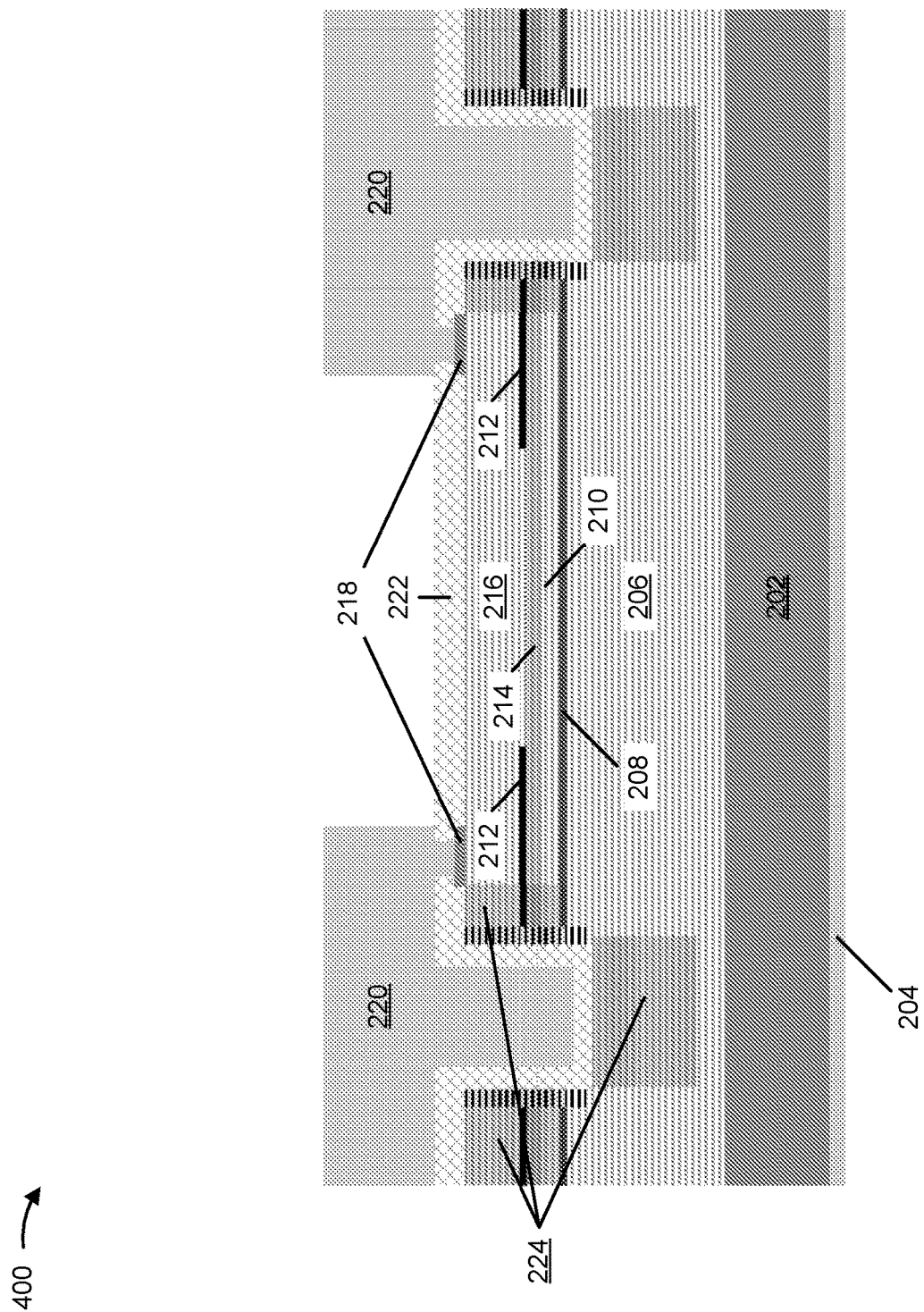

FIGS. 5A and 5B are diagrams illustrating a third example implementation of the VCSEL 200 with the tunnel junction 214, as described herein. In the example shown in FIGS. 5A and 5B, the p-type layer 210 is a p-type DBR, the tunnel junction 214 is on the p-type DBR, and the oxidation layer 212 is on the tunnel junction 214. As compared to the example implementation shown in FIGS. 3A and 3B and the example implementation shown in FIGS. 4A and 4B, the example implementation shown in FIGS. 5A and 5B moves more of the p-type DBR and the oxidation layer 212 above the tunnel junction 214, which may improve electrical resistance, optical loss, and current injection and, therefore, overall device performance.

The number, arrangement, thicknesses, order, symmetry, or the like, of layers shown in FIGS. 5A and 5B are provided as examples. In practice, VCSEL 200 may include additional layers, fewer layers, different layers, differently constructed layers, or differently arranged layers than those shown in FIGS. 5A and 5B.

FIGS. 6A and 6B are diagrams illustrating a fourth example implementation of the VCSEL 200 with the tunnel junction 214, as described herein. In the example shown in FIGS. 6A and 6B, the p-type layer 210 is a p-type spacer layer, the tunnel junction 214 is on the p-type spacer layer, and the oxidation layer 212 is on the tunnel junction 214. Notably, in the example implementation shown in FIGS. 6A and 6B, there is no p-DBR (i.e., the top mirror of the VCSEL 200 is composed entirely the n-type top mirror 216). Such a design may provide the largest improvement in performance as compared to the VCSEL 100.

The number, arrangement, thicknesses, order, symmetry, or the like, of layers shown in FIGS. 6A and 6B are provided as examples. In practice, VCSEL 600 may include additional layers, fewer layers, different layers, differently constructed layers, or differently arranged layers than those shown in FIGS. 6A and 6B.

As noted above, in the example implementations of the VCSEL 200 shown in FIGS. 3A and 3B, FIGS. 4A and 4B, FIGS. 5A and 5B, and FIGS. 6A and 6B, the top contact layer 218 and the top metal 220 are n-type materials (rather than a p-type material, as is the case in the VCSEL 100). Thus, the doping, metal compositions, metal deposition method, and/or alloying may need to be designed so as to achieve a low resistance contact that can also withstand later-performed wafer fabrication process steps, some of which are performed at a high temperature or, like the oxidation process, are performed under both high temperature and humidity. Therefore, in some cases, to simplify fabrication and follow similar manufacturing steps to those associated with manufacturing the VCSEL 100, the VCSEL 200 may include a second tunnel junction.

FIGS. 7A and 7B are diagrams illustrating an example VCSEL 200 with a tunnel junction 214 and a tunnel junction and 226, as described herein. As shown in FIGS. 7A and 7B, the (second) tunnel junction 226 may be placed on the n-type top mirror 216 (e.g., with a p++ layer continuing to the surface). In such an implementation, the top contact layer 218 and the top metal 220 may be p-type materials and, therefore, may be formed as a tunnel contact that is compatible with high temperature oxidation. Of note, the tunnel junction 226 may be of lower resistance than the tunnel junction 214 because the tunnel junction 214 may exposed to elevated growth temperatures for a comparatively shorter amount of time.

The number, arrangement, thicknesses, order, symmetry, or the like, of layers shown in FIGS. 7A and 7B are provided as examples. In practice, VCSEL 700 may include additional layers, fewer layers, different layers, differently constructed layers, or differently arranged layers than those shown in FIGS. 7A and 7B.

Figure 8A:
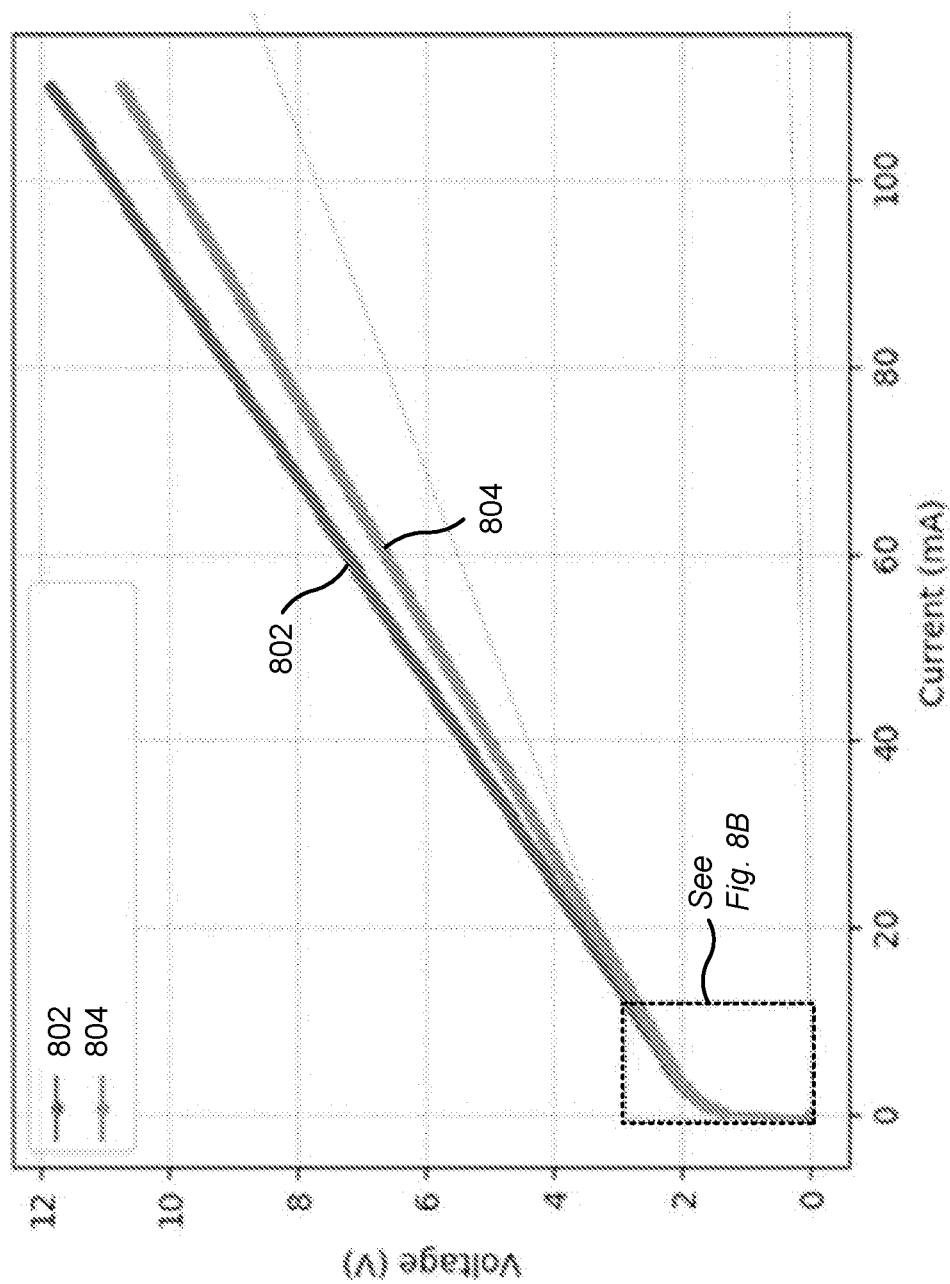
FIGS. 8A and 8B are diagrams illustrating a comparison of a typical current-voltage curve of a conventional VCSEL and a simulated current-voltage curve of a VCSEL including at tunnel junction.
Figure 8B:
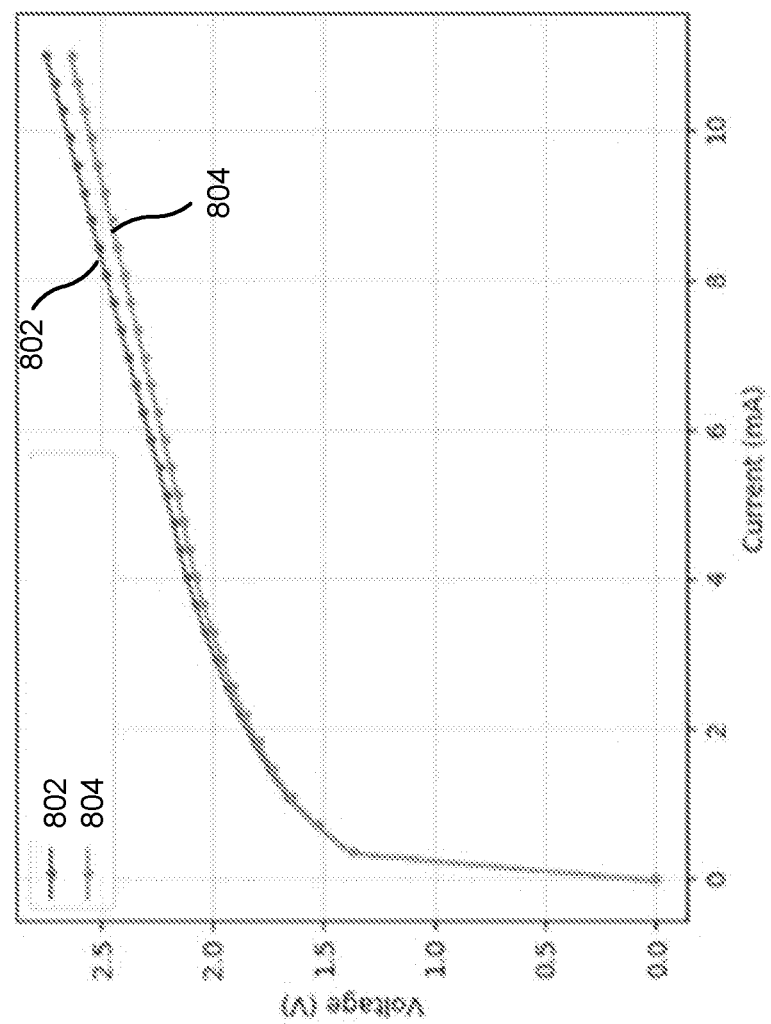

FIGS. 8A and 8B are diagrams illustrating a comparison of a typical current-voltage curve of the VCSEL 100 and a simulated current-voltage curve of the VCSEL 200. Line 802 corresponds to the VCSEL 100, and line 804 corresponds to the VCSEL 200 (i.e., the VCSEL in which some portion of p-type material is replaced with n-type material). In this example, resistance of the VCSEL 100 is 70 Ohms ($\Omega$), and a ratio of p-type DBR resistance to n-type DBR resistance is approximately 2. This gives approximately 40$\Omega$ for the p-type DBR, approximately 20$\Omega$ for the n-type DBR, and approximately 10$\Omega$ across other layers. In comparison, in the VCSEL 200, the resistance across the p-type DBR is reduced to approximately 25$\Omega$, and there is an additional resistance of 8$\Omega$ across the tunnel junction 214. In such case, the net result is a reduction in the voltage drop across the chip, which improves overall efficiency. This improvement is higher for devices that work with high peak current (e.g., typically with low duty cycle), such as a device used for direct time of flight sensing.

As indicated above, FIGS. 8A and 8B are provided as an example. Other examples may differ from what is described with regard to FIGS. 8A and 8B.

Figure 9:
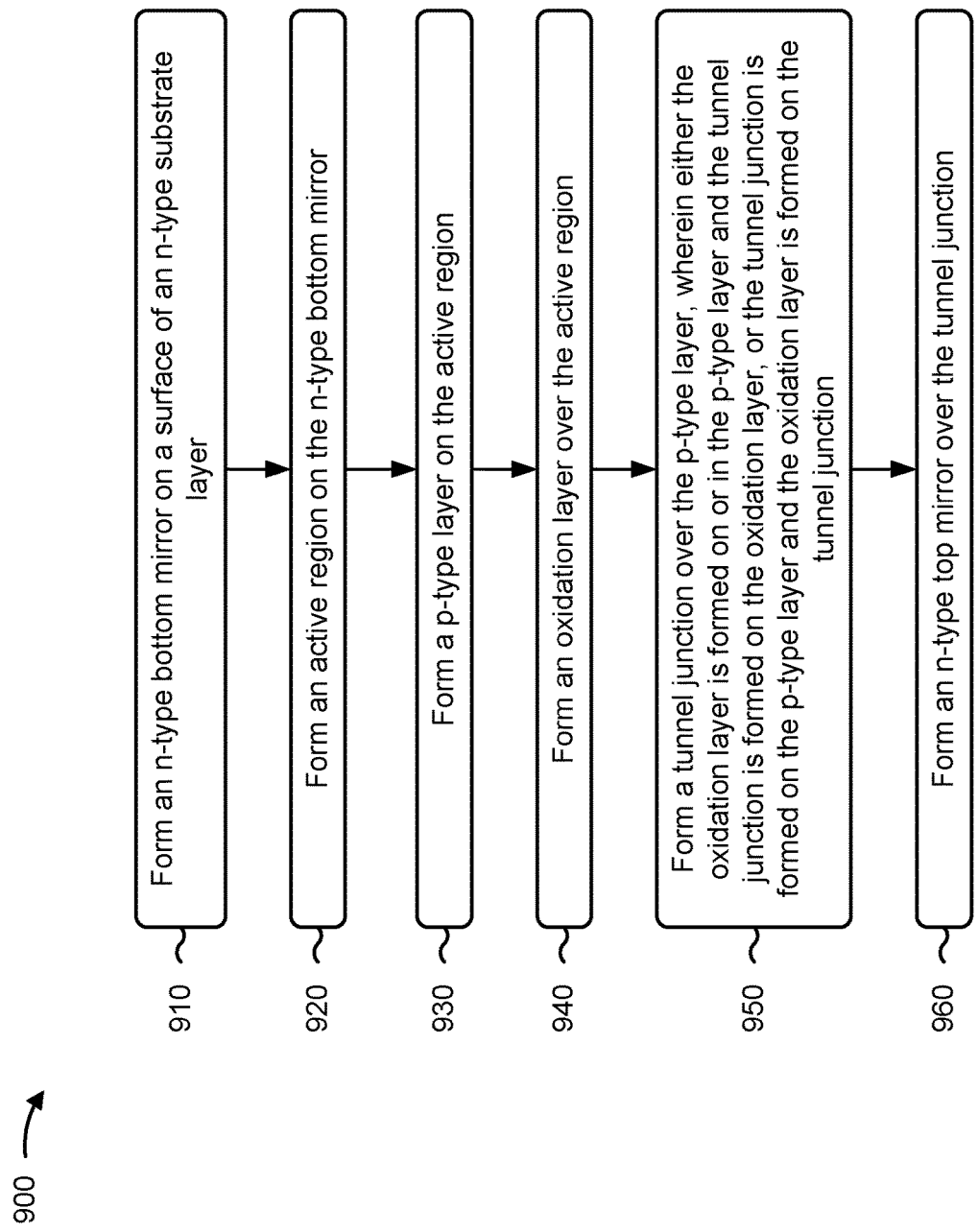
FIG. 9 is a flowchart of an example process relating to manufacturing a VCSEL including a tunnel junction, as described herein.

FIG. 9 is a flowchart of an example process 900 relating to manufacturing a VCSEL including a tunnel junction, as described herein.

As shown in FIG. 9, process 900 may include forming an n-type bottom mirror on a surface of an n-type substrate layer (block 910). For example, an n-type bottom mirror may be formed on a surface of an n-type substrate layer, as described above.

As further shown in FIG. 9, process 900 may include forming an active region on the n-type bottom mirror (block 920). For example, an active region may be formed on the n-type bottom mirror, as described above.

As further shown in FIG. 9, process 900 may include forming a p-type layer on the active region (block 930). For example, a p-type layer may be formed on the active region, as described above.

As further shown in FIG. 9, process 900 may include forming an oxidation layer over the active region (block 940). For example, an oxidation layer may be formed over the active region, as described above.

As further shown in FIG. 9, process 900 may include forming a tunnel junction over the p-type layer, wherein either the oxidation layer is formed on or in the p-type layer and the tunnel junction is formed on the oxidation layer, or the tunnel junction is formed on the p-type layer and the oxidation layer is formed on the tunnel junction (block 950). For example, a tunnel junction may be formed over the p-type layer, wherein either the oxidation layer is formed on or in the p-type layer and the tunnel junction is formed on the oxidation layer, or the tunnel junction is formed on the p-type layer and the oxidation layer is formed on the tunnel junction, as described above.

As further shown in FIG. 9, process 900 may include forming an n-type top mirror over the tunnel junction (block 960). For example, an n-type top mirror may be formed over the tunnel junction, as described above.

Process 900 may include additional implementations, such as any single implementation or any combination of implementations described below and/or in connection with one or more other processes described elsewhere herein.

In a first implementation, process 900 includes forming an n-type top contact layer on the n-type top mirror and forming an n-type top metal on the n-type top contact layer.

In a second implementation, alone or in combination with the first implementation, the p-type layer is a p-type DBR.

In a third implementation, alone or in combination with one or more of the first and second implementations, the p-type layer is a p-type spacer layer.

In a fourth implementation, alone or in combination with one or more of the first through third implementations, process 900 includes forming another tunnel junction on the n-type top mirror, forming a p-type top contact layer on the other tunnel junction, and forming a p-type top metal on the p-type top contact layer.

In a fifth implementation, alone or in combination with one or more of the first through fourth implementations, the oxidation layer is in the n-type top mirror.

In a sixth implementation, alone or in combination with one or more of the first through fifth implementations, the p-type layer has fewer than six layer pairs.

In a seventh implementation, alone or in combination with one or more of the first through sixth implementations, the p-type layer has a thickness that is less than or equal to 0.5 microns.

Although FIG. 9 shows example blocks of process 900, in some implementations, process 900 may include additional blocks, fewer blocks, different blocks, or differently arranged blocks than those depicted in FIG. 9. Additionally, or alternatively, two or more of the blocks of process 900 may be performed in parallel.

The foregoing disclosure provides illustration and description, but is not intended to be exhaustive or to limit the implementations to the precise form disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "over," "under," "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A vertical-cavity surface-emitting laser (VCSEL), comprising:
   an n-type substrate layer having a top surface and a bottom surface;
   an n-type metal on the bottom surface of the n-type substrate layer,
      wherein the n-type metal is a cathode of the VCSEL;
   an n-type bottom mirror on the top surface of the n-type substrate layer;

an active region on the n-type bottom mirror;
a p-type layer on the active region;
an oxidation layer over the active region,
  wherein the oxidation layer is to provide optical and electrical confinement of the VCSEL;
a tunnel junction over the p-type layer,
  wherein the tunnel junction is to reverse a carrier type of an n-type top mirror, and
  wherein either:
    the oxidation layer is on or in the p-type layer and the tunnel junction is on the oxidation layer, or
    the tunnel junction is on the p-type layer and the oxidation layer is on the tunnel junction;
the n-type top mirror over the tunnel junction;
a top contact layer over the n-type top mirror;
a dielectric layer on an isolation implant; and
a top metal on the top contact layer and on the dielectric layer,
  wherein the top metal is an anode of the VCSEL.

2. The VCSEL of claim 1, wherein the top contact layer is an n-type contact layer and the top metal is another n-type metal, the n-type contact layer being on the n-type top mirror and the other n-type metal being on the n-type contact layer.

3. The VCSEL of claim 1, wherein the p-type layer is a p-type distributed Bragg reflector (DBR).

4. The VCSEL of claim 1, wherein the p-type layer is a p-type spacer layer.

5. The VCSEL of claim 1, wherein the oxidation layer is in the n-type top mirror.

6. The VCSEL of claim 1, wherein the p-type layer has fewer than six layer pairs.

7. The VCSEL of claim 1, wherein the p-type layer has a thickness that is less than or equal to 0.5 microns.

8. The VCSEL of claim 1, further comprising another tunnel junction, the other tunnel junction being on the n-type top mirror,
  wherein the top contact layer is a p-type contact layer and the top metal is p-type metal, the p-type contact layer being on the other tunnel junction and the p-type metal being on the p-type contact layer.

9. A vertical-cavity surface-emitting laser (VCSEL) array, comprising:
  an active region on an n-type bottom mirror;
  a p-type layer on the active region;
  an oxidation layer over the active region to provide optical and electrical confinement of VCSELs in the VCSEL array;
  a tunnel junction over the p-type layer to reverse a carrier type of an n-type top mirror that is over the tunnel junction, wherein the tunnel junction is over the p-type layer and the oxidation layer is on the tunnel junction;
  a dielectric layer on the n-type top mirror and on an isolation implant; an n-type top contact layer on the n-type top mirrors; and an n-type top metal on the n-type top contact layer and on the dielectric layer.

10. The VCSEL array of claim 9, wherein the p-type layer is a p-type distributed Bragg reflector (DBR).

11. The VCSEL array of claim 9, wherein the p-type layer is a p-type spacer layer.

12. The VCSEL array of claim 9, wherein the oxidation layer is in the n-type top mirror.

13. The VCSEL array of claim 9, wherein the p-type layer has fewer than six layer pairs or has a thickness that is less than or equal to 0.5 microns.

14. The VCSEL array of claim 9, further comprising another tunnel junction, a p-type top contact layer, and a p-type top metal,
  wherein the other tunnel junction is on the n-type top mirror, the p-type top contact layer is on the other tunnel junction and the p-type top metal is on the p-type top contact layer.

15. A method, comprising:
  forming an n-type bottom mirror on a surface of an n-type substrate layer;
  forming an active region on the n-type bottom mirror;
  forming a p-type layer on the active region;
  forming an oxidation layer over the active region;
  forming a tunnel junction over the p-type layer, wherein the tunnel junction is formed on the p-type layer and the oxidation layer is formed over the tunnel junction;
  forming an n-type top mirror over the tunnel junction;
  forming a dielectric layer on the n-type top mirror and on an isolation implant; forming an n-type top contact layer on the n-type top mirror, and forming an n-type top metal on the n-type top contact layer and on the dielectric layer.

16. The method of claim 15, wherein the p-type layer is a p-type distributed Bragg reflector (DBR).

17. The method of claim 15, wherein the p-type layer is a p-type spacer layer.

18. The method of claim 15, further comprising:
  forming another tunnel junction on the n-type top mirror,
  forming a p-type top contact layer on the other tunnel junction, and
  forming a p-type top metal on the p-type top contact layer.

* * * * *